US008975976B2

United States Patent
Hu et al.

(10) Patent No.: US 8,975,976 B2
(45) Date of Patent: Mar. 10, 2015

(54) MULTI-POWER MODE REFERENCE CLOCK WITH CONSTANT DUTY CYCLE

(71) Applicant: Qualcomm Incorporated, San Diego, CA (US)

(72) Inventors: Jingyu Hu, San Diego, CA (US); Michael Naone Farias, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 70 days.

(21) Appl. No.: 13/787,230

(22) Filed: Mar. 6, 2013

(65) Prior Publication Data

US 2014/0253251 A1   Sep. 11, 2014

(51) Int. Cl.
*H03L 5/02*   (2006.01)
(52) U.S. Cl.
CPC ........................................ *H03L 5/02* (2013.01)
USPC ........... 331/109; 331/186; 331/185; 331/182; 331/183; 331/158
(58) Field of Classification Search
USPC .......................................................... 331/109
See application file for complete search history.

(56) References Cited

U.S. PATENT DOCUMENTS

| | | | |
|---|---|---|---|
| 5,757,242 A * | 5/1998 | Chow et al. | 331/57 |
| 7,109,770 B1 | 9/2006 | Bui | |
| 7,983,375 B2 | 7/2011 | Dulger et al. | |
| 8,344,816 B2 * | 1/2013 | Akaike et al. | 331/158 |
| 2004/0124934 A1 * | 7/2004 | Senthilkumar et al. | 331/158 |
| 2006/0255871 A1 * | 11/2006 | Kamiya | 331/158 |
| 2007/0236302 A1 * | 10/2007 | Sakai et al. | 331/158 |
| 2010/0117703 A1 | 5/2010 | Zhu et al. | |
| 2012/0081174 A1 | 4/2012 | Bos et al. | |
| 2012/0194255 A1 | 8/2012 | Ferreira | |

* cited by examiner

*Primary Examiner* — Joseph Chang
(74) *Attorney, Agent, or Firm* — Arent Fox LLP (57) ABSTRACT

A power management apparatus and method for maintaining a substantially constant duty cycle of a reference clock signal in a multi-power oscillator, includes a first output power transistor in electrical parallel with a series arrangement of a second output power transistor and a switch, and a crystal oscillator capacitively coupled to a common gate of the first and second output power transistors, wherein a level of the reference clock signal power output is a normal power level when the switch is open and the level of the reference clock signal power output is a higher power level when the switch is closed to operate the second output power transistor in parallel with the first output power transistor.

16 Claims, 7 Drawing Sheets

| Power Mode | Mode ctrl1 | Mode ctrl2 | Mb, fix | Mb1 | Mb2 | Mbias, total | Vb, dc | Mout, total | Current | Duty Cycle |
|---|---|---|---|---|---|---|---|---|---|---|
| NPM | Low | High | $M_u$ | $1.25M_u$ | 0 | $2.25M_u$ | N/A | $M_n$ | $I_{NPM}$ | Good |
| HPM | Low | Low | $M_u$ | 0 | 0 | $M_u$ | Higher than NPM | $M_n$ | $2*I_{NPM}$ | ~1% Worse From NPM |

FIG. 7

| Power Mode | Mode ctrl1 | Mode ctrl2 | Mode ctrl3 | Mb, fix | Mb1 | Mb2 | Mbias, total | Vb, dc | Mout, total | Current | Duty Cycle |
|---|---|---|---|---|---|---|---|---|---|---|---|
| NPM | Low | Low | Low | $3.5M_u$ | 0 | 0 | $3.5M_u$ | N/A | $M_n$ | $I_{NPM}$ | Good |
| HPM | Low | Low | High | $3.5M_u$ | 0 | 0 | $3.5M_u$ | Same as NPM | $2*M_n$ | $2*I_{NPM}$ | Same as NPM (within ±0.1%) |

FIG. 8

MULTI-POWER MODE REFERENCE CLOCK WITH CONSTANT DUTY CYCLE

BACKGROUND

1. Field

The present disclosure relates generally to reference clocks in integrated circuits. More specifically the present disclosure relates to maintaining constant duty cycle in a reference clock over multiple power operating modes.

2. Background

In a typical power management integrated circuit (PMIC) system, there are usually a few reference clock outputs distributed to external RF chips (such as WAN, WLAN, GPS, etc.) used in portable devices. To meet tight phase noise requirements for RF clock delivery, an on-chip crystal oscillator (XO) is usually designed to provide an accurate clock source with its frequency set by an external crystal (XTAL).

In wireless communication systems there is a need for a reference clock to synchronize signals. A wireless communication system may support communication for multiple wireless communication devices at the same time. In use, a wireless communication device may communicate with one or more base stations by transmissions on the uplink and downlink. Base stations may be referred to as access points, Node Bs, or other similar terms. The uplink or reverse link refers to the communication link from the wireless communication device to the base station, while the downlink or forward link refers to the communication from the base station to the wireless communication devices.

Wireless communication systems may be multiple access systems capable of supporting communication with multiple users by sharing the available system resources, such as bandwidth and transmit power. Examples of such multiple access systems include code division multiple access (CDMA) systems, time division multiple access (TDMA) systems, frequency division multiple access (FDMA) systems, wideband code division multiple access (WCDMA) systems, global system for mobile (GSM) communication systems, enhanced data rates for GSM evolution (EDGE) systems, and orthogonal frequency division multiple access (OFDMA) systems.

Figure 1:
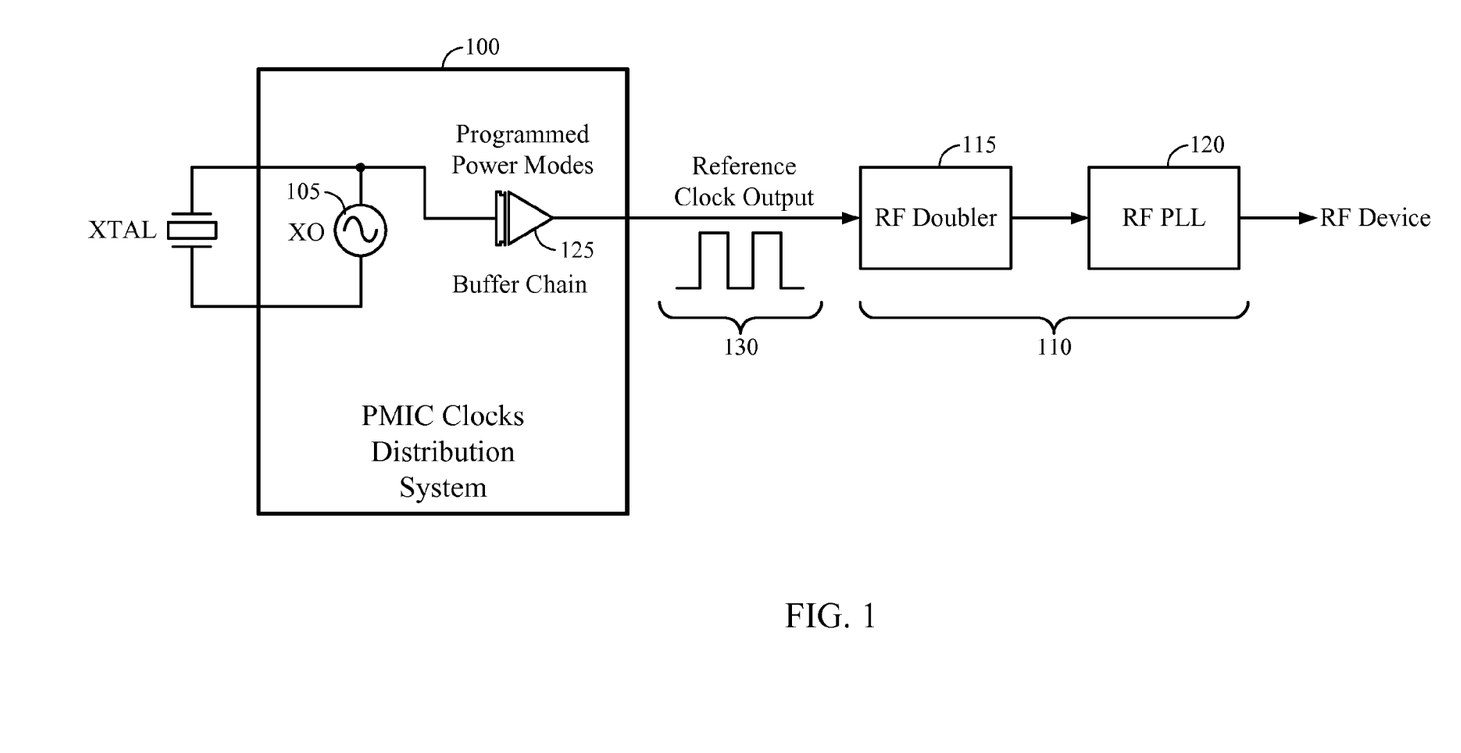
FIG. 1 illustrates a reference clock with multi power modes.

Referring to FIG. 1, a typical reference clock output signal 130 with multiple power modes is delivered from the XO 105 in the power management integrated circuit (PMIC) 100 to a radio frequency (RF) section 110 including a radio frequency (RF) doubler 115 and a phase lock loop (PLL) 120. In order to convert the sinusoidal oscillation signal to a rail-to-rail signal (square wave) to be used with the RF devices, one or more programmable power buffers 125 needs to be inserted after the XO 105 before delivering the reference clock. The power programmable buffer chain 125 of amplification in the PMIC 100 sets the power mode level of the output reference clock signal 130. A higher power mode (compared with a normal power mode) is usually needed when lower phase noise at the clock output 130 is needed for better RF quality. The normal power mode is used to save power and improve battery life when the phase noise requirement is less stringent.

The RF device usually needs a good duty cycle from the reference clock under both normal power mode (NPM) and high power mode (HPM). For example, a Long Term Evolution (LTE) chip may typically need a duty cycle in the range ~48%-52%, which is preferably kept stable (within ±0.1%) over multiple clock power modes. If the duty cycle of the output reference clock 130 is degraded in high power mode (HPM) relative to NPM, it can cause unwanted PLL reference and fractional spurs on the RF chip.

Thus there is a need to design a multi-power mode reference clock with constant and good duty cycle over multiple power modes.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In accordance with one or more aspects and corresponding disclosure thereof, various aspects are described in connection with providing and maintaining constant duty cycle in a reference clock over multiple power operating modes.

In an embodiment, a power management apparatus for maintaining a substantially constant duty cycle of a reference clock signal in a multi-power oscillator, includes a first output power transistor in electrical parallel with a series arrangement of a second output power transistor and a switch; and a crystal oscillator capacitively coupled to a common gate of the first and second output power transistors, wherein a level of the reference clock signal power output is a normal power level when the switch is open and the level of the reference clock signal power output is a higher power level when the switch is closed to operate the second output power transistor in parallel with the first output power transistor.

In another embodiment, a method of maintaining a stable duty cycle reference clock in a multi-power oscillator power management circuit, includes providing an oscillator signal to a gate of a first power output transistor to output a reference clock signal at a first "normal" power level, providing the oscillator signal to a gate of a second power output transistor in parallel with the first power output transistor, wherein a switch is in series with the second power output transistor, and closing the switch to place the second power output transistor in operable electrical parallel with the first power output transistor to output the reference clock signal at a second, power level such that the combined output power level is "higher" than the first power output transistor output level alone.

DETAILED DESCRIPTION

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

As used in this application, the terms "component," "module," "system" and the like are intended to include a computer-related entity, such as, but not limited to hardware, firmware, a combination of hardware and software, software, or software in execution. For example, a component may be, but is not limited to being, a process running on a processor, a processor, an object, an executable, a thread of execution, a program and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

As used herein, the term "determining" encompasses a wide variety of actions and therefore, "determining" can include calculating, computing, processing, deriving, investigating, looking up (e.g., looking up in a table, a database or another data structure), ascertaining and the like. Also, "determining" can include resolving, selecting choosing, establishing, and the like.

The phrase "based on" does not mean "based only on," unless expressly specified otherwise. In other words, the phrase "based on" describes both "based only on" and "based at least on."

Moreover, the term "or" is intended to man an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

The various illustrative logical blocks, modules, and circuits described in connection with the present disclosure may be implemented or performed with a general purpose processor, a digital signal processor (DSP), an application specific integrated circuit (ASIC), a field programmable gate array (FPGA), or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core or any other such configuration.

The steps of a method or algorithm described in connection with the present disclosure may be embodied directly in hardware, in a software module executed by a processor or in a combination of the two. A software module may reside in any form of storage medium that is known in the art. Some examples of storage media that may be used include RAM memory, flash memory, ROM memory, EPROM memory, EEPROM memory, registers, a hard disk, a removable disk, a CD-ROM, and so forth. A software module may comprise a single instruction, or many instructions, and may be distributed over several different code segments, among different programs and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in software, the functions may be stored as one or more instructions on a computer-readable medium. A computer-readable medium may be any available medium that can be accessed by a computer. By way of example, and not limitation, a computer-readable medium may comprise RAM, ROM, EEPROM, CD-ROM or other optical disk storage, magnetic disk storage, or other magnetic storage devices, or any other medium that can be used to carry or store desired program code in the form of instructions or data structures and that can be accessed by a computer. Disk and disc, as used herein, includes compact disk (CD), laser disk, optical disc, digital versatile disk (DVD), floppy disk, and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Further, it should be appreciated that modules and/or other appropriate means for performing the methods and techniques described herein can be downloaded and/or otherwise obtained by a mobile device and/or base station as applicable. For example, such a device can be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a mobile device and/or base station can obtain the various methods upon coupling or providing the storage means to the device. Moreover, any other suitable technique for providing the methods and techniques described herein to a device can be utilized.

Furthermore, various aspects are described herein in connection with a terminal, which can be a wired terminal or a wireless terminal. A terminal can also be called a system, device, subscriber unit, subscriber station, mobile station, mobile, mobile device, remote station, remote terminal, access terminal, user terminal, communication device, user agent, user device, or user equipment (UE). A wireless terminal may be a cellular telephone, a satellite phone, a cordless telephone, a Session Initiation Protocol (SIP) phone, a wireless local loop (WLL) station, a personal digital assistant (PDA), a handheld device having wireless connection capability, a computing device, or other processing devices connected to a wireless modem. Moreover, various aspects are described herein in connection with a base station. A base station may be utilized for communicating with wireless terminal(s) and may also be referred to as an access point, a Node B, or some other terminology.

The techniques described herein may be used for various wireless communication networks such as Code Division Multiple Access (CDMA) networks, Time Division Multiple Access (TDMA) networks, Frequency Division Multiple Access (FDMA) networks, Orthogonal FDMA (OFDMA) networks, Single-Carrier FDMA (SC-FDMA) networks, etc. The terms "networks" and "systems" are often used interchangeably. A CDMA network may implement a radio technology such as Universal Terrestrial Radio Access (UTRA), CDMA2000, etc. UTRA includes Wideband CDMA (W-CDMA). CDMA2000 covers IS-2000, IS-95 and technology such as Global System for Mobile Communication (GSM).

An OFDMA network may implement a radio technology such as Evolved UTRA (E-UTRA), the Institute of Electrical and Electronics Engineers (IEEE) 802.11, IEEE 802.16, IEEE 802.20, Flash-OFDAM®, etc. UTRA, E-UTRA, and GSM are part of Universal Mobile Telecommunication System (UMTS). Long Term Evolution (LTE) is a release of UMTS that uses E-UTRA. UTRA, E-UTRA, GSM, UMTS, and LTE are described in documents from an organization named "$3^{rd}$ Generation Partnership Project" (3GPP). CDMA2000 is described in documents from an organization named "$3^{rd}$ Generation Partnership Project 2" (3GPP2). These various radio technologies and standards are known in the art. For clarity, certain aspects of the techniques are described below for LTE, and LTE terminology is used in much of the description below. It should be noted that the LTE terminology is used by way of illustration and the scope of the disclosure is not limited to LTE. Rather, the techniques described herein may be utilized in various application involving wireless transmissions, such as personal area networks (PANs), body area networks (BANs), location, Bluetooth, GPS, UWB, RFID, and the like. Further, the techniques may also be utilized in wired systems, such as cable modems, fiber-based systems, and the like.

Single carrier frequency division multiple access (SC-FDMA), which utilizes single carrier modulation and frequency domain equalization has similar performance and essentially the same overall complexity as those of an OFDMA system. SC-FDMA signal may have lower peak-to-average power ration (PAPR) because of its inherent single carrier structure. SC-FDMA may be used in the uplink communications where the lower PAPR greatly benefits the mobile terminal in terms of transmit power efficiency.

Figure 2:
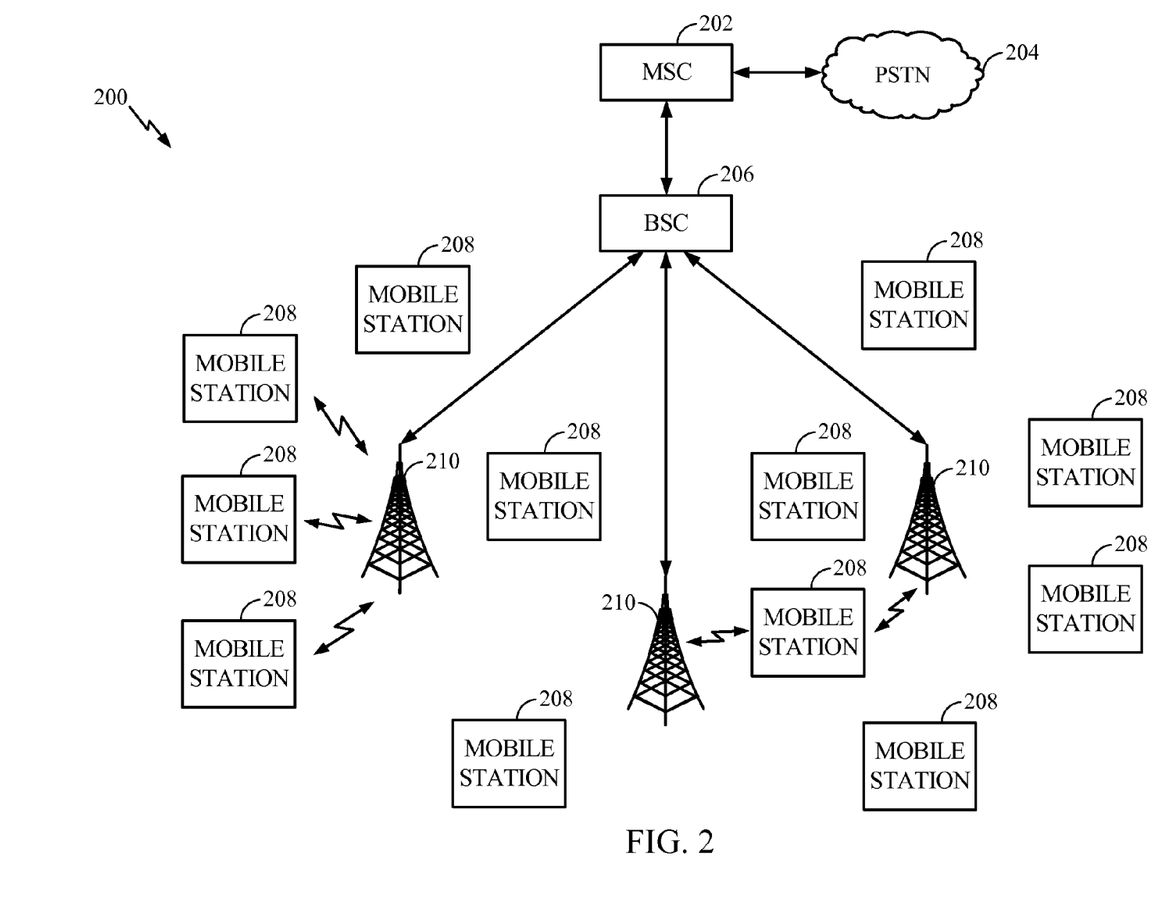
FIG. 2 illustrates a wireless system in accordance with certain embodiments of the disclosure.

FIG. 2 illustrates a wireless system 200 that may include a plurality of mobile stations 208, a plurality of base stations 210, a base station controller (BSC) 206, and a mobile switching center (MSC) 202. The system 200 may be GSM, EDGE, WCDMA, CDMA, etc. The MSC 202 may be configured to interface with a public switched telephone network (PTSN) 204. The MSC 202 may also be configured to interface with the BSC 206. There may be more than one BSC 206 in the system 100. Each base station 210 may include at least one sector, where each sector may have an omnidirectional antenna or an antenna pointed in a particular direction radially away from the base stations 210. Alternatively, each sector may include two antennas for diversity reception. Each base station 210 may be designed to support a plurality of frequency assignments. The intersection of a sector and a frequency assignment may be referred to as a channel. The mobile stations 208 may include cellular or portable communication system (PCS) telephones.

During operation of the cellular telephone system 200, the base stations 210 may receive sets of reverse link signals from sets of mobile stations 208. The mobile stations 208 may be involved in telephone calls or other communications. Each reverse link signal received by a given base station 210 may be processed within that base station 210. The resulting data may be forwarded to the BSC 206. The BSC 206 may provide call resource allocation and mobility management functionality including the orchestration of soft handoffs between base stations 210. The BSC 206 may also route the received data to the MSC 202, which provides additional routing services for interfacing with the PSTN 204. Similarly, the PTSN 204 may interface with the MSC 202, and the MSC 202 may interface with the BSC 206, which in turn may control the base stations 210 to transmit sets of forward link signals to sets of mobile stations 208.

Figure 3:
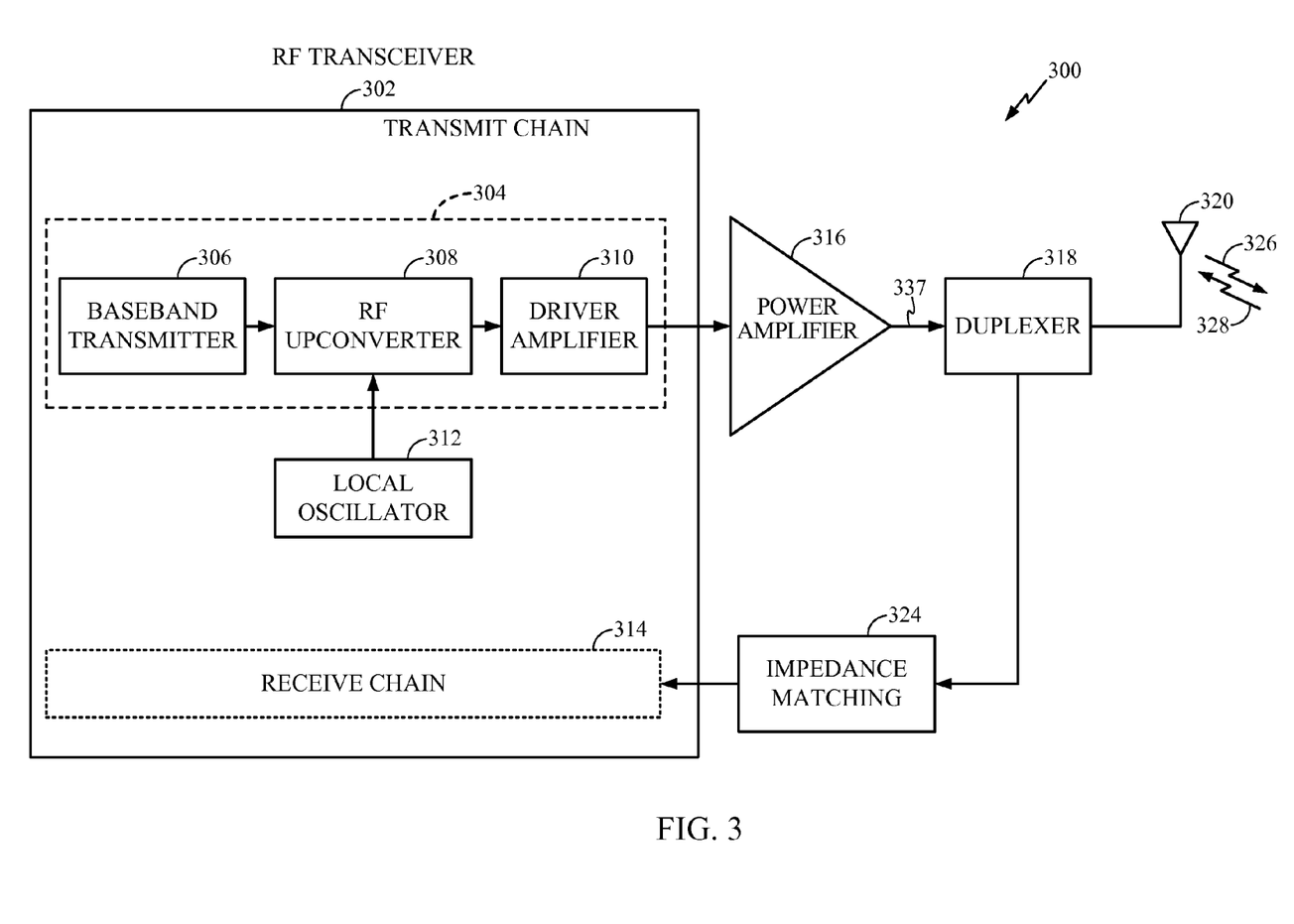
FIG. 3 is a block diagram illustrating an example of electronic components capable of transmitting in accordance with certain embodiments of the disclosure.

FIG. 3 is a block diagram illustrating one example of electronic components 300, capable of transmitting. The electronic components 300 may be part of a mobile station 208, a base station 210, or any other type of device that may transmit. The electronic components 300 may include a power amplifier (PA) 316. Tests may be conducted in order to optimize the performance and efficiency of the amplifier 316. In one scenario the tests may be conducted before the components 300 are marketed, that is, before an end user acquires the components 300. In one example, the configuration 300 may include a radio frequency (RF) transceiver 302. The transceiver 302 may transmit outgoing signals 326 and receive incoming signals 328 via an antenna 320. A transmit chain 304 may be used to process signals that are to be transmitted and a receive chain 314 may be implemented to process signals received by the transceiver 302. An incoming signal 328 may be processed by a duplexer 318 and impedance matching 324 of the incoming signal 328 may occur. The incoming signal 228 may then be processed by the receive chain 314.

Figures 4A, 4B, 4C:
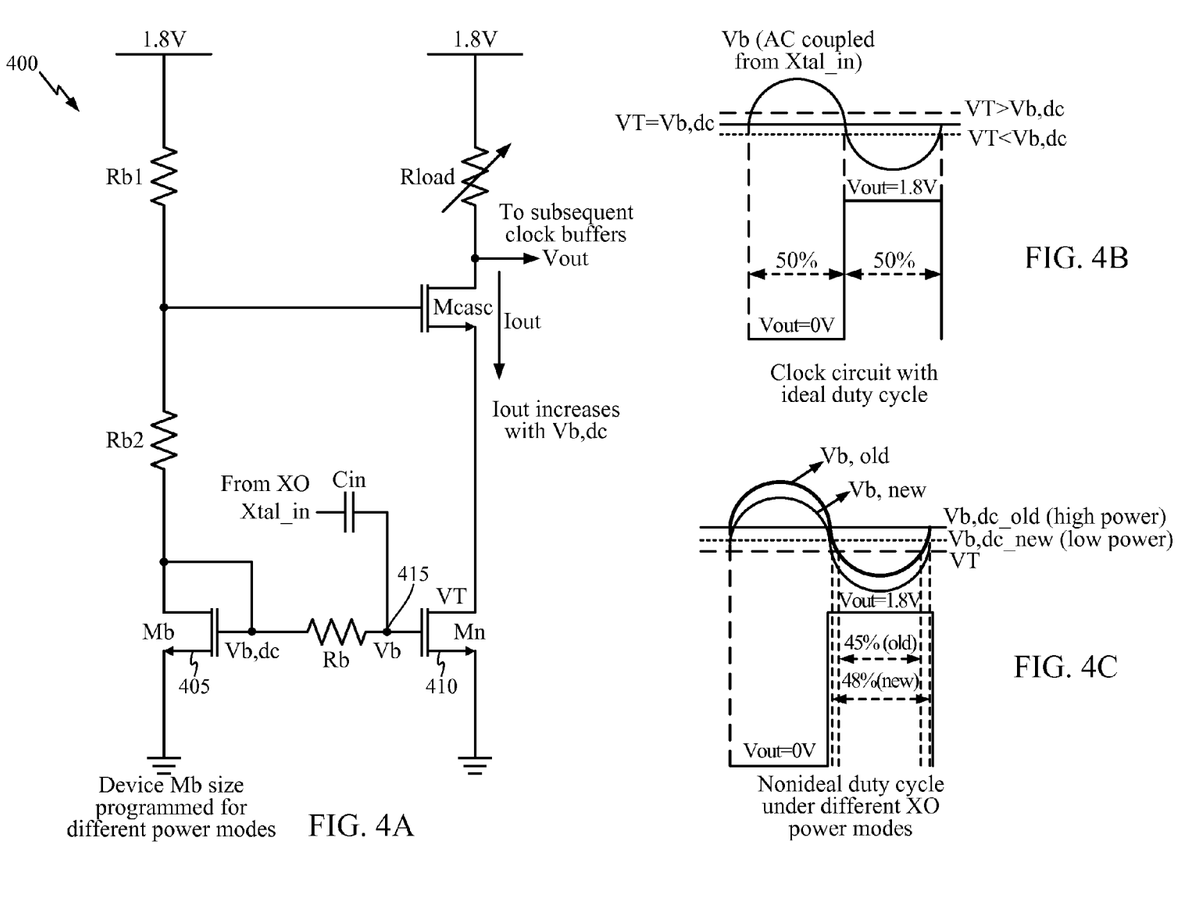
FIG. 4A depicts a typical multi-power RF preamplifier that may be found in a transmitting component in accordance with certain embodiments of the disclosure.
FIG. 4B depicts the output of a clock circuit having ideal duty cycle.
FIG. 4C depicts the output of a clock circuit having non-ideal duty cycle characteristics under different crystal oscillator power modes.

FIG. 4A shows a typical multi-power RF preamplifier 400 that may be found in a transmitting component 300. The current of the first stage of the XO buffer chain (called RF preamplifier 400) is usually programmed for different power modes. One way to design a multi-power mode RF preamplifier 400 is to control the DC gate voltage (Vb,dc) of a bias MOS device (or transistor) Mb 405 for different power modes, which is done by tuning the channel width-to-length (W/L) ratio (or size) of Mb 405. The voltage difference between Vb,dc and threshold voltage (VT) of an output common-source MOS device Mn 410 determines how good the output clock duty cycle is. However, the size (current capacity) of Mb 405 also impacts Vb,dc (which is also the DC voltage of node Vb 415), and thus duty cycle of the output clock varies with power modes. For example, if a higher power mode is required, Mb 405 may be sized smaller to generate a higher Vb,dc (hence higher output current $I_{out}$), but this may come at a sacrifice of a worse duty cycle than in the normal power mode.

FIG. 4B shows that an ideal duty cycle may be a constant 50% whether VT is greater than, equal to, or less than Vb,dc. However, under different XO power mode conditions, the duty cycle may vary in a non-ideal manner, as shown in FIG. 4C.

Figure 5:
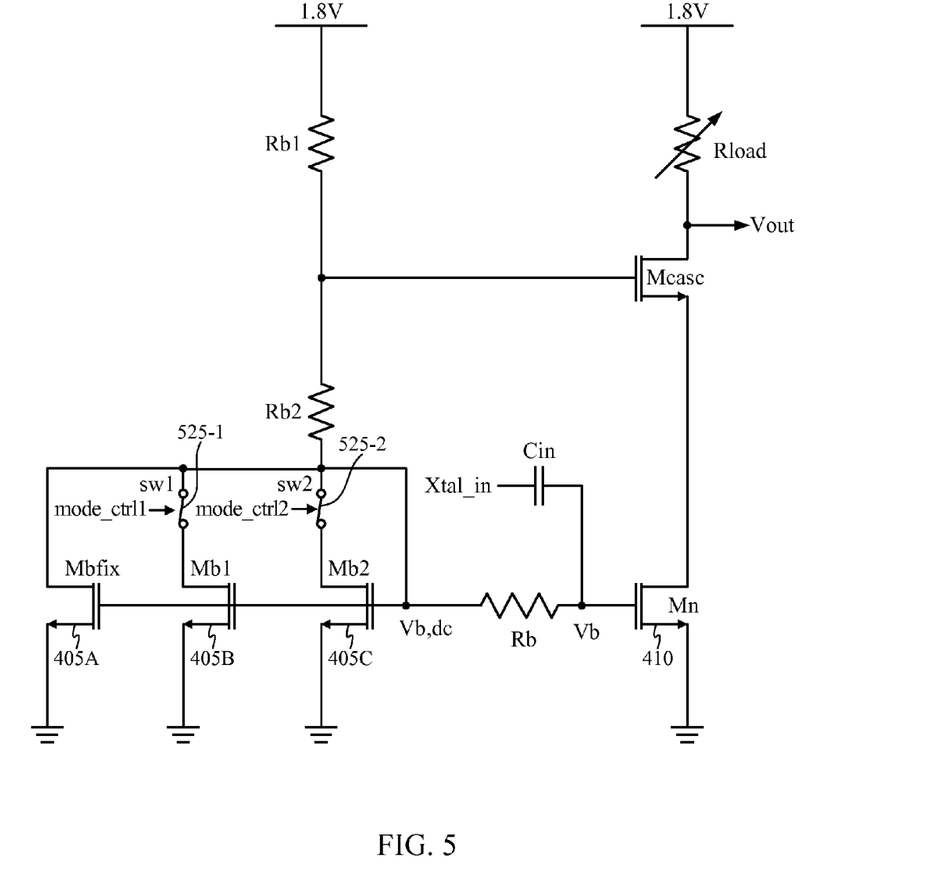
FIG. 5 illustrates a reference clock circuit that lacks constant duty cycle over different power modes.
Figure 6:
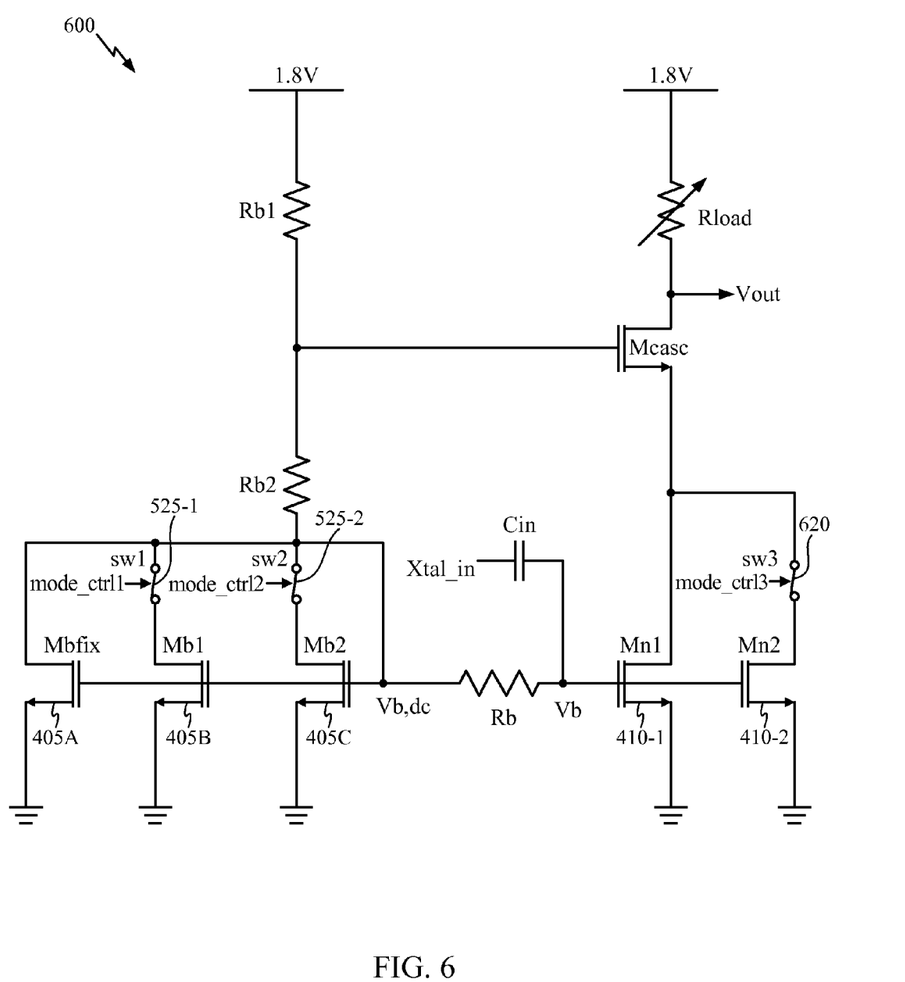
FIG. 6 depicts a reference clock with a plurality of output transistor devices in parallel in accordance with certain embodiments of the disclosure.

A reference clock is disclosed that provides a stable duty cycle over different power modes of particular interest. E.g., two active power modes may be set, for example: Normal Power Mode (NPM) and High Power Mode (HPM). One way to keep duty cycle constant over clock power modes is to tune the output device Mn 410 size instead of tuning the bias device Mb 405 size, where Mb 405 may include a plurality of devices Mb,fix 405A, Mb1 405B and Mb2 405C, etc. as shown in FIGS. 5 and 6. Mb,fix 405A is a bias device that is always operable on ("fixed") in the circuit of the reference clock. Mb1 405B and Mb2 405C are two "auxiliary" bias devices in parallel with each other and Mb,fix 405A, and which may be electrically added in parallel to Mb,fix 405A when switches 525-1 and 525-2 are set "on," respectively. It is understood that a different number of "auxiliary" bias devices and corresponding switches may be added in parallel without loss of generality. Adding bias devices reduces the current.

FIG. 5 illustrates a reference clock circuit, however, that lacks constant duty cycle over all power modes, for lack of an ability to tune the output device Mn 410 size.

In FIG. 6, the output device includes two transistors Mn1 410-1 and Mn2 410-2. Switches sw1 525-1 and sw2 525-2 are all off in NPM and HPM. With switch sw3 620 off (mode_ctrl3=low), Mn1 410-1 is used as the only output device for NPM. With switch sw3 620 on (mode_ctrl3=high), Mn1 410-1 in parallel with Mn2 410-2 comprises the output device section for HPM, with corresponding higher current/power. As bias transistor Mb 405 is fixed in size between NPM and HPM, gate DC voltage Vb,dc is fixed, so the duty cycle of the output clock remains unchanged under both power modes.

Figure 7:
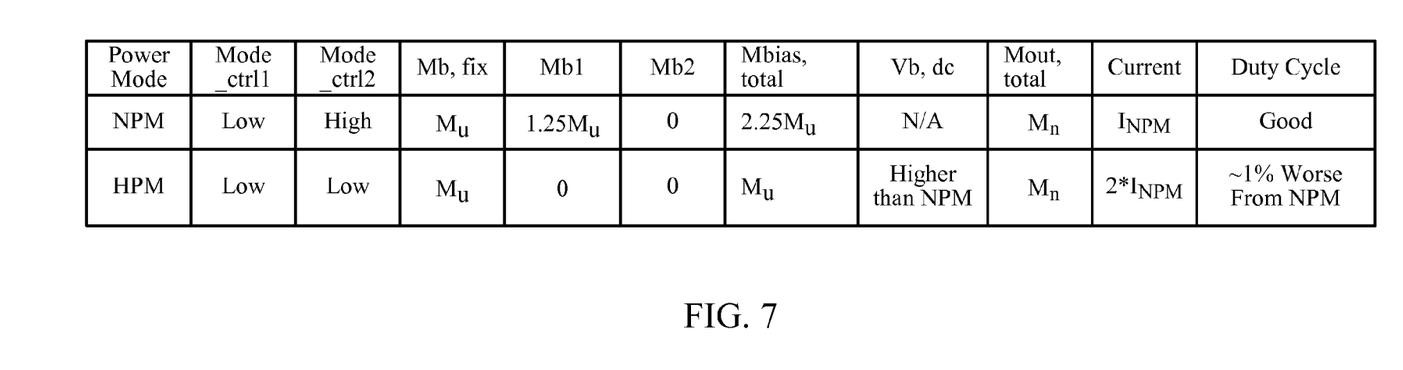
FIG. 7 is a comparison of duty cycle performance based on device sized for the clock circuit of FIG. 5.
Figure 8:
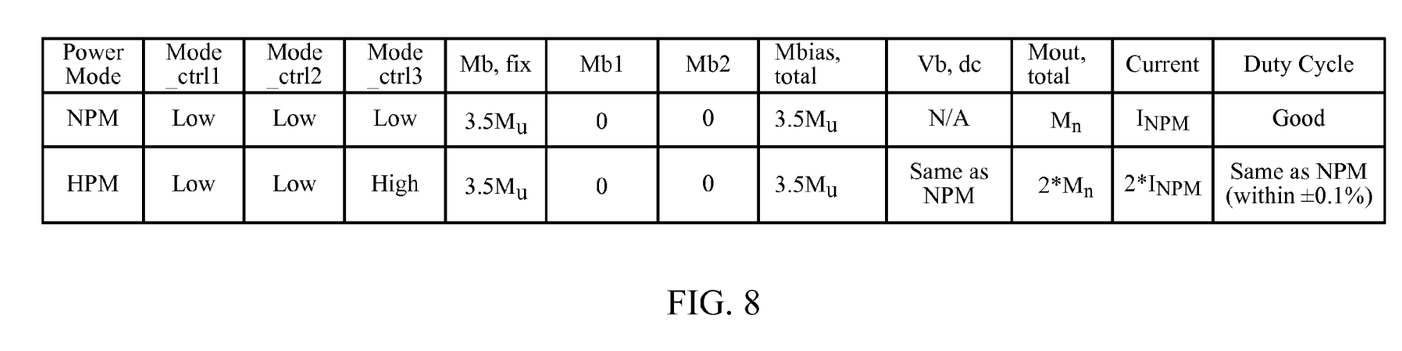
FIG. 8 is a comparison of duty cycle performance based on device sized for the clock circuit of FIG. 6 in accordance with certain embodiments of the disclosure.

A comparison of duty cycle performance based on device sizes for the clock circuit of FIG. 5 is shown in FIG. 7. FIG. 8 is a comparison of duty cycle performance based on device sized for the clock circuit of FIG. 6. In the figures, Mu represents a unit size of the bias device and Mn a unit size of the output device. Referring to FIG. 8, representative of the clock circuit of FIG. 6, with output device switching and Mn1 identical to Mn2 in FIG. 4, in HPM the total output device size Mout,total is twice as large as in NPM for a 2× higher output current than in NPM. Since the total bias device size Mbias, total remains unchanged from NPM to HPM while output device switching is used, the duty cycle remains stable.

It is understood that the specific order or hierarchy of steps in the processes disclosed is an illustration of exemplary approaches. Based upon design preferences, it is understood that the specific order or hierarchy of steps in the processes may be rearranged. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A power management apparatus for maintaining a substantially constant duty cycle of a reference clock signal in a multi-power oscillator, comprising:
a first output power transistor in electrical parallel with a series arrangement of a second output power transistor and a switch; and
a crystal oscillator capacitively coupled to a common gate of the first and second output power transistors, wherein a level of the reference clock signal power output is a normal power level when the switch is open and the level of the reference clock signal power output is a higher power level when the switch is closed to operate the second output power transistor in parallel with the first output power transistor.

2. The apparatus of claim 1, wherein an output of the apparatus is a reference clock signal of a substantially fixed duty cycle in a normal power mode when the switch is open.

3. The apparatus of claim 1, wherein the output of the apparatus is a reference clock signal of the substantially same fixed duty cycle in a high power mode when the switch is closed.

4. The apparatus of claim 1, wherein the switch comprises an MOS switch.

5. The apparatus of claim 1, further comprising a bias device MOS transistor in parallel with the first and second output power transistors, wherein a gate of the bias device MOS transistor is coupled to the common gate of the first and second output power transistors.

6. The apparatus of claim 5, wherein the bias device MOS transistor comprises a fixed bias device and a one or more auxiliary bias devices in parallel, wherein each auxiliary bias device includes a series switch.

7. The apparatus of claim 1, wherein the duty cycle of the reference clock remains substantially constant to within ±0.1%.

8. A power management apparatus for maintaining a substantially constant duty cycle reference clock signal output, comprising:
a first output device in electrical parallel with a series arrangement of a second output device and a switch; and
a frequency source device capacitively coupled to the first output device and the second output device, wherein a level of the reference clock signal power output is a normal power level when the switch is open and the level of the reference clock signal power output is a higher power level when the switch is closed to operate the second output power device in parallel with the first output power device.

9. The apparatus of claim 8, wherein an output of the apparatus is a reference clock signal of a substantially fixed duty cycle in a normal power mode when the switch is open.

10. The apparatus of claim 8, wherein the output of the apparatus is a reference clock signal of the substantially same fixed duty cycle in a high power mode when the switch is closed.

11. The apparatus of claim 8, wherein the switch comprises an MOS switch.

12. The apparatus of claim 8, further comprising a bias device in parallel with the first output device and the second output device, wherein the bias device is coupled to the first output device and the second output device.

13. The apparatus of claim 12, wherein the bias device comprises a fixed bias device and one or more auxiliary bias devices in parallel, wherein each auxiliary bias device includes a series switch.

14. The apparatus of claim 8, wherein the duty cycle of the reference clock signal remains substantially constant to within ±0.1%.

15. A method of maintaining a stable duty cycle reference clock signal in a multi-power oscillator power management circuit, comprising:

providing an oscillator signal to a gate of a first power output transistor to output a reference clock signal at a first normal power level;

providing the oscillator signal to a gate of a second power output transistor in parallel with the first power output transistor, wherein a switch is in series with the second power output transistor; and closing the switch to place the second power output transistor in operable electrical parallel with the first power output transistor to output the reference clock signal at a second power level such that the combined output power level is a higher power output level than the first power output transistor output level alone.

16. The method of claim 15, wherein the duty cycle of the reference clock signal is constant within ±0.1% at both normal and higher power levels.

\* \* \* \* \*